United States Patent
Ohishi

(10) Patent No.: US 7,635,930 B2
(45) Date of Patent: Dec. 22, 2009

(54) STAGE APPARATUS

(75) Inventor: Shinji Ohishi, Oyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 327 days.

(21) Appl. No.: 11/754,051

(22) Filed: May 25, 2007

(65) Prior Publication Data

US 2008/0001482 A1    Jan. 3, 2008

(30) Foreign Application Priority Data

Jun. 29, 2006    (JP) .............................. 2006-179816

(51) Int. Cl.
*G03B 27/62* (2006.01)
*H02K 41/02* (2006.01)

(52) U.S. Cl. .................. 310/12.01; 310/12; 310/15; 33/358; 33/361

(58) Field of Classification Search .............. 310/15, 310/12, 12.01; 33/358, 361
See application file for complete search history.

(56) References Cited

U.S. PATENT DOCUMENTS

| | | | | |
|---|---|---|---|---|
| 5,841,250 A | * | 11/1998 | Korenage et al. | ............ 318/135 |
| 6,903,468 B2 | | 6/2005 | Korenaga | |
| 2004/0095563 A1 | * | 5/2004 | Korenaga | ..................... 355/51 |

FOREIGN PATENT DOCUMENTS

JP    2004-079639 A    3/2004

* cited by examiner

*Primary Examiner*—Quyen Leung
*Assistant Examiner*—Terrance Kenerly
(74) *Attorney, Agent, or Firm*—Canon U.S.A., Inc., IP Division

(57) ABSTRACT

At least one exemplary embodiment is directed to a stage apparatus which includes a stage movable in a first direction, a linear motor configured to drive the stage in the first direction, a magnet unit having first magnets disposed on the stage and second magnets disposed at both ends of a stroke of the stage such that the same poles of the first and second magnets face each other, and a supporting member supporting the second magnets. The supporting member is supported movably in the first direction.

8 Claims, 11 Drawing Sheets

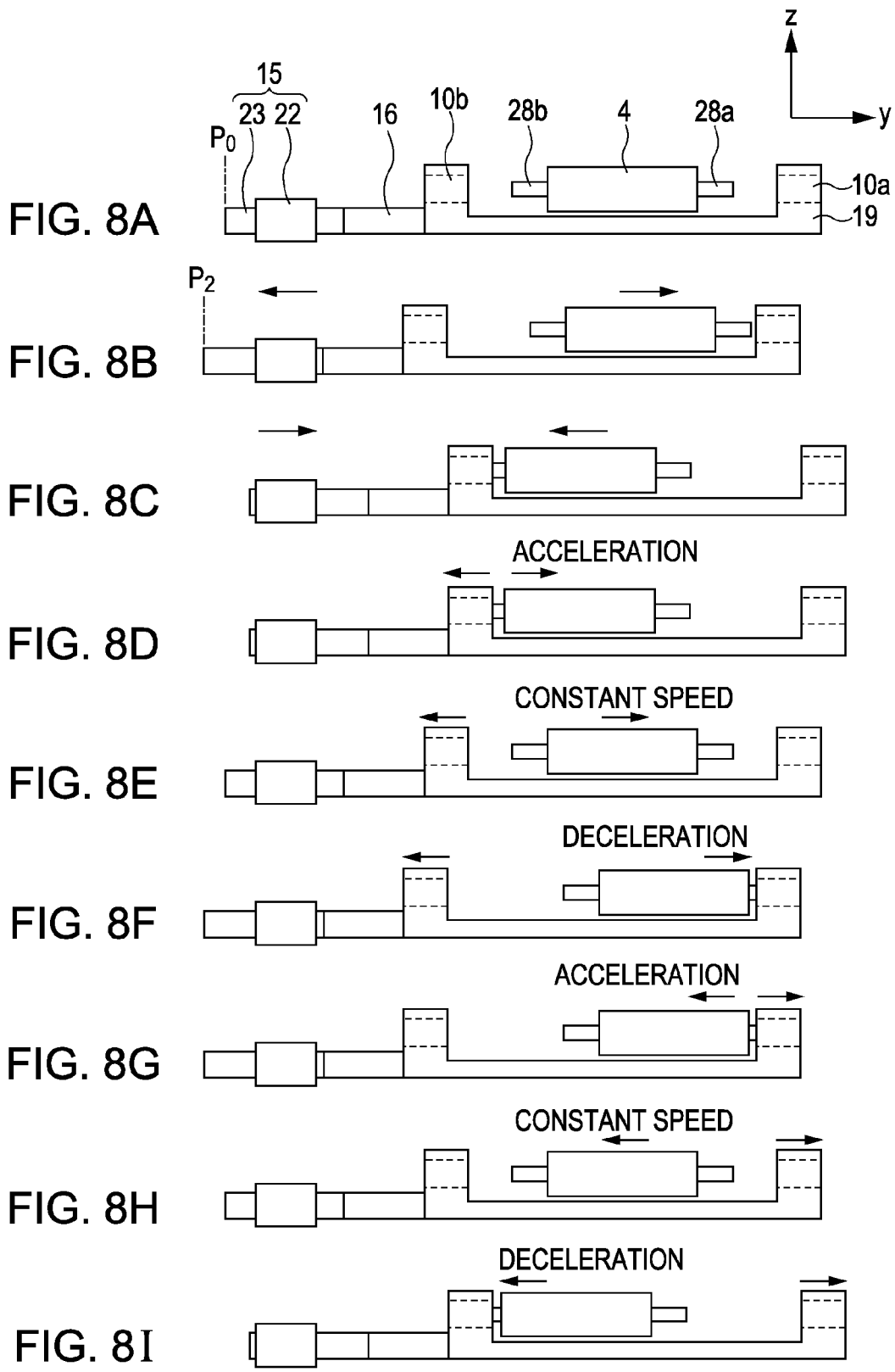

STAGE APPARATUS

BACKGROUND OF THE INVENTION

1. Field of the Invention

The present invention relates to stage apparatuses for positioning an object mounted thereon, and more particularly, though not exclusively, to stage apparatuses which can be used as reticle stages for exposure apparatuses.

2. Description of the Related Art

Stage apparatuses are used in exposure apparatuses to position a substrate or an original (hereinafter collectively referred to as a substrate). Japanese Patent Laid-Open No. 2004-079639 discusses a stage apparatus that utilizes the repulsive force of permanent magnets to accelerate or decelerate a stage holding a substrate.

The stage apparatus discussed in Japanese Patent Laid-Open No. 2004-079639 will be described with reference to FIGS. 12A and 12B. A stage 104 holding a substrate 103 is movable along a guide 102 in the Y direction. The stage 104 has linear motor sliders 105 and is driven in the Y direction by a force generated between the linear motor sliders 105 and linear motor stators 106 attached to a base (not shown).

The stage 104 has a pair of permanent magnets 109 in the front and rear thereof in the direction in which the stage 104 is moved. The guide 102 has two pairs of upper and lower permanent magnets 112 separated by a predetermined distance. The permanent magnets 109 and 112 are magnetized in the Z direction so that opposing surfaces thereof have the same pole. When the permanent magnets 109 are inserted between the permanent magnets 112 at either end of the stroke of the stage 104, a repulsive force is generated therebetween to accelerate or decelerate the stage 104.

The stage 104 causes a drive reaction force when driven by the repulsive force of the permanent magnets 109 and 112. The drive reaction force vibrates the entire apparatus. Such vibration disturbs the positioning control of the stage 104, thus contributing to decreased positioning accuracy or extended positioning time.

SUMMARY OF THE INVENTION

The present invention is directed to a stage apparatus utilizing the repulsive force of permanent magnets and having a suitable mechanism for suppressing stage reaction force.

A stage apparatus according to at least one exemplary embodiment of the present invention includes a stage movable in a first direction, a linear motor configured to drive the stage in the first direction, a magnet unit having first magnets disposed on the stage and second magnets disposed at both ends of a stroke of the stage such that the same poles of the first and second magnets face each other, and a supporting member supporting the second magnets. The supporting member is supported movably in the first direction.

Further features of the present invention will become apparent from the following description of exemplary embodiments with reference to the attached drawings.

BRIEF DESCRIPTION OF THE DRAWINGS

FIGS. 8A to 8I are diagrams illustrating the operation of a stage in a fourth exemplary embodiment of the present invention.

DESCRIPTION OF THE EMBODIMENTS

Figure 1A:
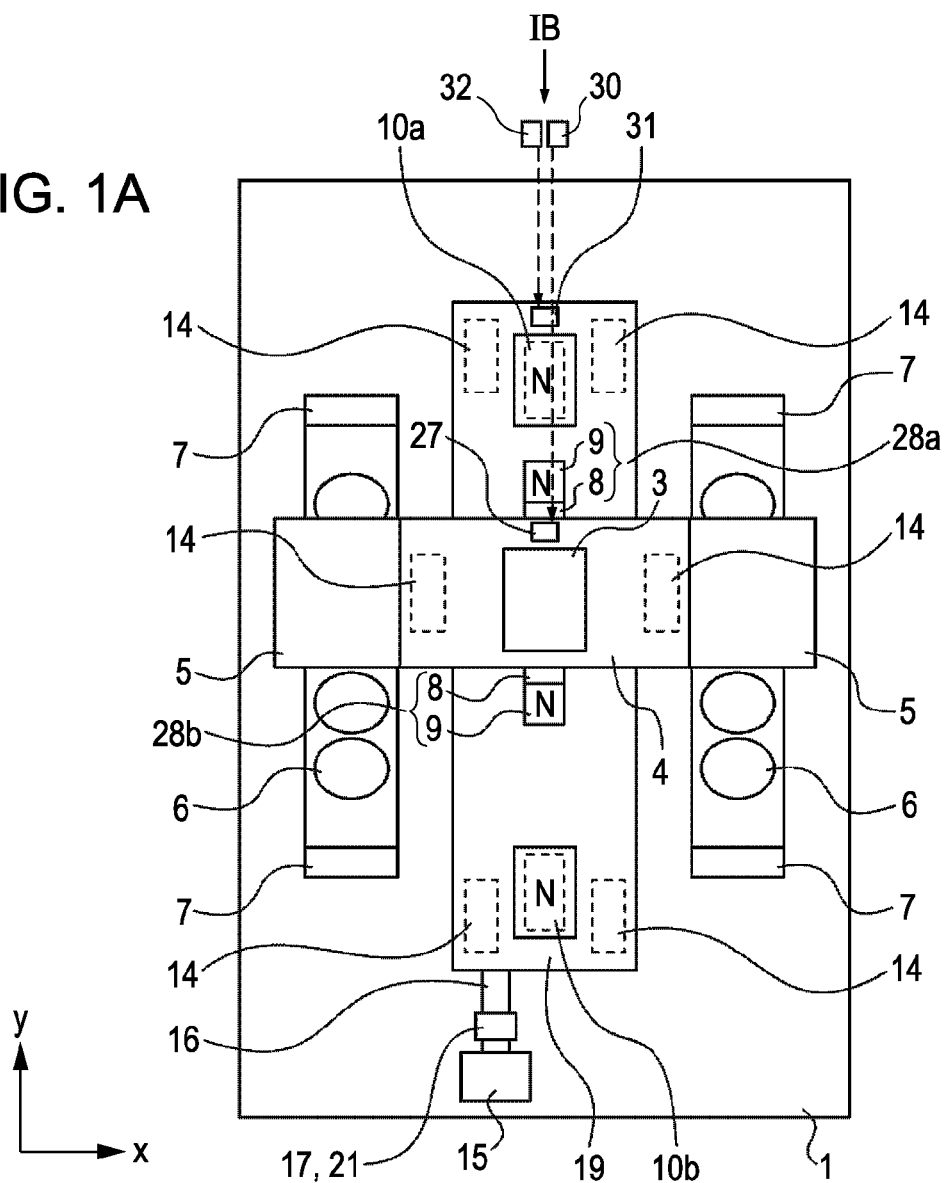
FIGS. 1A and 1B are diagrams of a stage apparatus according to a first exemplary embodiment of the present invention.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the magnets and their materials.

In all of the examples illustrated and discussed herein any specific values should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

Note that herein when referring to correcting or corrections of an error (e.g., a positioning error), or canceling a force, a reduction of the error or force and/or a correction of the error or cancellation of the force is intended.

First Exemplary Embodiment

Figure 1B:
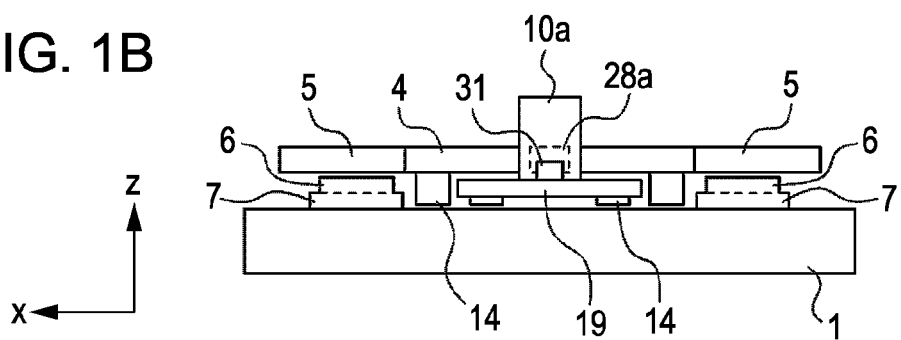

FIG. 1A is a plan view of a stage apparatus according to a first exemplary embodiment of the present invention. FIG. 1B is a side view of the stage apparatus as viewed in the direction of arrow IB of FIG. 1A.

The stage apparatus includes a stage 4 that moves with a substrate 3 mounted thereon, a base 1 that guides the stage 4 with bearings 14 (e.g., gas bearings) disposed therebetween, a linear motor that drives the stage 4 in the Y direction, and a repulsive magnet unit that accelerates or decelerates the stage 4 in the Y direction. The term "movement direction" used hereinafter indicates the Y direction. The base 1 has a guide surface parallel to the XY plane. The bearings 14 can be replaced with another type of bearing according to the accuracy required for the stage 4. The substrate 3 is held, for example by a chuck (not shown) fixed to the stage 4. The chuck used can be, for example, a clamp, a vacuum suction unit, an electrostatic attraction unit, or any other fastening device as known by one of ordinary skill in the relevant art.

Alternatively, the substrate 3 can be mounted on an additional precision stage provided on the stage 4. The precision stage can be driven in short strokes relative to the stage 4 to position the substrate 3 with increased precision. The drive direction of the precision stage is not limited to any particular direction; for example, the precision stage can be driven in the X, Y, or Z direction or can also be rotated about any of such axes.

The linear motor includes sliders 5 having permanent magnets fixed to both sides of the stage 4 and stators 6 having coils arranged in the movement direction of the stage 4. These coils are fixed to the base 1 with supports 7 disposed therebetween. The permanent magnets of the sliders 5 can be disposed opposite the coils without contact. The stage 4 can be driven without contact in the Y direction by a Lorentz force generated by supplying a current to the coils with the magnetic flux of the permanent magnets passing therethrough. Such a linear motor structure is discussed in Japanese Patent Laid-Open No. 2004-079639, the contents of which are hereby incorporated by reference herein in their entirety, and thus a detailed description thereof will be omitted. The structure of the linear motor is not limited to the above structure, and another type of linear motor structure can be used.

The position of the stage 4 can be measured using a laser interferometer 30. This interferometer 30 irradiates a reflective mirror 27 disposed on the stage 4 with measurement light emitted from a light source disposed outside the stage 4 to measure the position of the stage 4 according to interference of reflected light and reference light. The position measurement is not limited to the position of the stage 4 in the Y direction. For example, a plurality of measurement axes can be used to measure the position of the stage 4 in a rotational direction about the X axis or the Z axis. The linear motor described above can be controlled according to the measured position of the stage 4. The instrument used to measure the position of the stage 4 is not limited to a laser interferometer, and another type of instrument can be used as known by one of ordinary skill in the relevant art.

Figure 2:
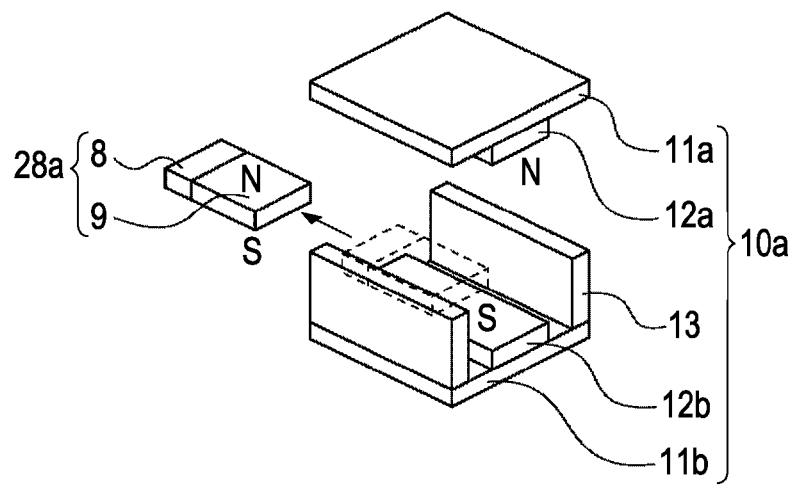
FIG. 2 is a diagram of an example of a repulsive magnet unit that can be used in the first exemplary embodiment.

Next, the repulsive magnet unit that accelerates or decelerates the stage 4 will be described with reference to FIG. 2. The repulsive magnet unit includes movable magnet parts 28a and 28b and fixed magnet parts 10a and 10b. The movable magnet part 28a and the fixed magnet part 10a will be described with reference to FIG. 2, although the movable magnet part 28b and the fixed magnet part 10b can have the same structures.

The movable magnet part 28a includes a permanent magnet 9 and a support 8 supporting the permanent magnet 9 on the stage 4. The permanent magnet 9 is plate-shaped and magnetized vertically. In this exemplary embodiment, the permanent magnet 9 can be a monopole permanent magnet having its north pole on its top surface and its south pole on its bottom surface.

The fixed magnet part 10a includes a pair of upper and lower permanent magnets 12a and 12b separated from each other and yokes 11a, 11b, and 13 for circulating a magnetic flux generated therefrom. The permanent magnets 12a and 12b are fixed to the yokes 11a and 11b, respectively. The fixed magnet part 10a includes the two magnets 12a and 12b as paired magnets, although it can also include two or more pairs of permanent magnets. The permanent magnets 12a and 12b can be plate-shaped and magnetized vertically. The permanent magnets 12a and 12b can be magnetized so that the same poles of the permanent magnet 9 and the permanent magnets 12a and 12b face each other. That is, the upper permanent magnet 12a can be a monopole permanent magnet having its north pole on its bottom surface while the lower permanent magnet 12b is a monopole permanent magnet having its south pole on its top surface.

The distance between the permanent magnets 12a and 12b is larger than the thickness of the permanent magnet 9. The distance between the pair of yokes 13 on both sides of the permanent magnets 12a and 12b can be larger than the width of the permanent magnet 9.

The movable magnet parts 28a and 28b can be disposed in the front and rear of the stage 4 in the movement direction thereof. The fixed magnet parts 10a and 10b can be disposed away from the stage 4 in the movement direction thereof, that is, at the respective ends of the stroke of the stage 4. When the stage 4 is driven in the Y direction, the permanent magnets 9 can be inserted without contact between the pairs of permanent magnets 12a and 12b near the respective ends of the stroke of the stage 4 (represented by the dotted line of FIG. 2).

In this structure, a magnetic repulsive force generated between the permanent magnet 9 and the permanent magnets 12a and 12b can accelerate or decelerate the stage 4 in the movement direction thereof. The repulsive magnet unit can sustain the repulsive force for an extended period of time as the stage 4 is moved in the Y direction because the acceleration or deceleration direction (the direction of the arrow of FIG. 2) is perpendicular to the magnetization direction of the permanent magnets 9 and the permanent magnets 12a and 12b. In addition, the repulsive magnet unit can cancel out a repulsive force directed in the Z direction because the permanent magnet 9 is inserted between the permanent magnets 12a and 12b. The above arrangement of the repulsive magnet unit can be used for a stage apparatus including a reciprocating stage.

The fixed magnet parts 10a and 10b can undergo a drive reaction force when the stage 4 is driven by the repulsive magnet unit. If the drive reaction force is transferred to the base 1, it can vibrate the entire apparatus. Such vibration disturbs the positioning control of the stage 4, thus contributing to decreased positioning accuracy or extended positioning time. Accordingly, the stage apparatus according to this exemplary embodiment has a reaction-canceling mechanism.

The reaction-canceling mechanism will be described with reference to FIGS. 1A and 1B. The pair of fixed magnet parts 10a and 10b are fixed to a supporting member 19 movably supported on the base 1 with other bearings 14 disposed therebetween. The bearings 14 can be replaced with another type of bearing according to the accuracy required for the stage 4.

When the repulsive magnet unit applies an acceleration or deceleration force to the stage 4, the fixed magnet parts 10a and 10b undergo a reaction force opposing the force. The fixed magnet parts 10a and 10b and the supporting member 19 are then moved in the direction of the reaction force because, as described above, the supporting member 19 is movable and the fixed magnet parts 10a and 10b are fixed thereto. The supporting member 19 can therefore function as a counter mass to cancel out the reaction force. The mass of the supporting member 19 can be readily increased to reduce the distance over which the counter mass is moved to cancel out the reaction force. This allows for a reduction in the footprint of the apparatus.

Figure 3:
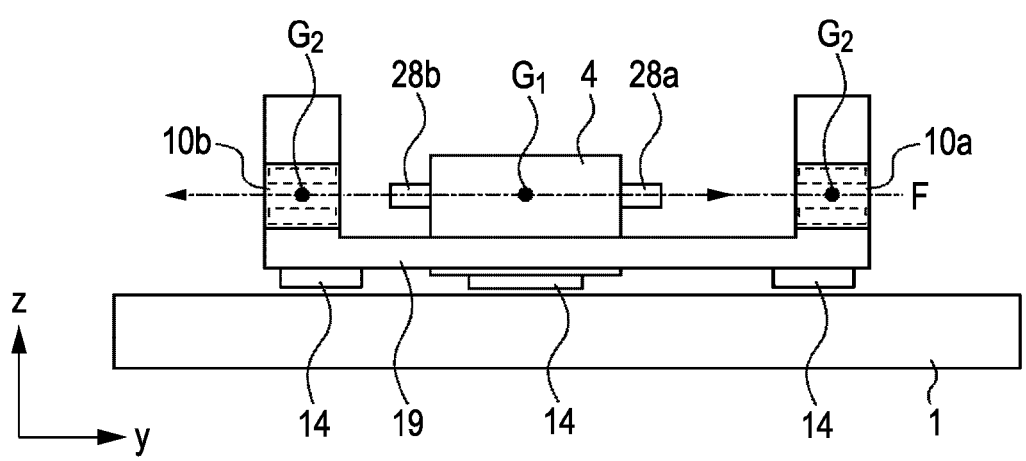
FIG. 3 is a side view of the stage apparatus of FIG. 1A as viewed in the X direction.

FIG. 3 is a side view illustrating the center of gravity $G_1$ of the stage 4, the centers of gravity $G_2$ of the supporting member 19 and the fixed magnet parts 10a and 10b, and the line of action F of the force generated by the repulsive magnet unit. A rotational force occurs during driving if the centers of gravity $G_1$ and $G_2$ are positioned at different heights. Such a rotational force can vibrate the stage apparatus. As shown in FIG. 3, the height of the center of gravity $G_1$ of the stage 4 can be aligned to those of the centers of gravity $G_2$ of the supporting member 19 and the fixed magnet parts 10a and 10b. In particular, the heights of the centers of gravity $G_1$ and $G_2$ can also be aligned to that of the line of action F of the force generated by the repulsive magnet unit.

The reaction-canceling mechanism further includes a driving unit 15 configured to drive the supporting member 19, a coupling member 16 configured to couple the driving unit 15 and the supporting member 19, and a holding unit 17 configured to hold the supporting member 19 relative to the base 1 and keep it in place.

Figure 4A:
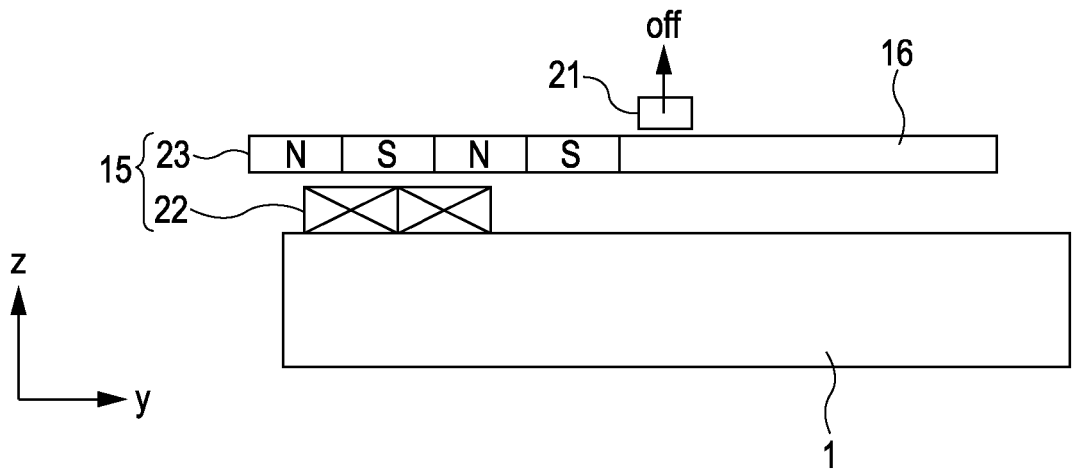
FIGS. 4A and 4B are diagrams of a driving unit driving a supporting member.
Figure 4B:
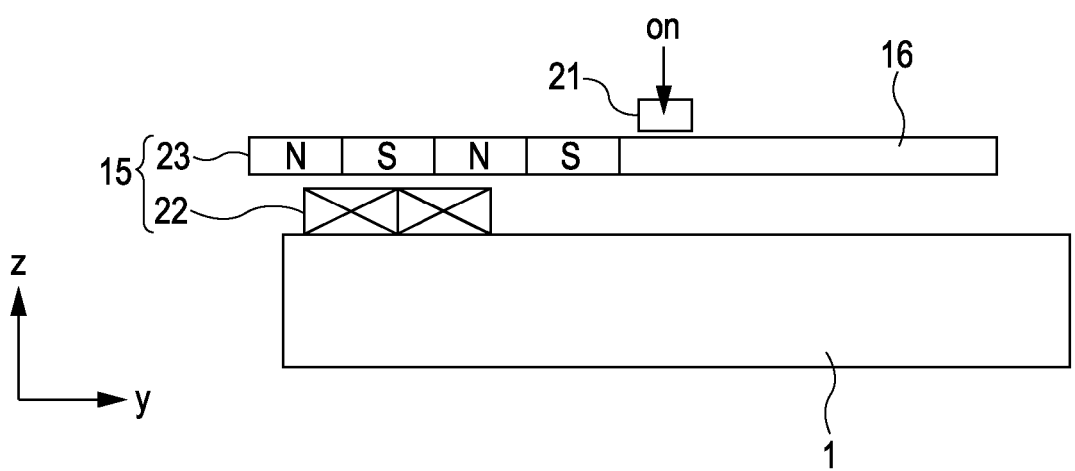

FIGS. 4A and 4B are detailed diagrams of the driving unit 15. The driving unit 15 includes permanent magnets 23 fixed to the coupling member 16 coupled to the supporting member 19 and coils 22 fixed to the base 1. The permanent magnets 23, which are disposed opposite the coils 22, are driven in the Y direction by energizing the coils 22, and accordingly the supporting member 19 coupled to the permanent magnets 23 is driven in the Y direction. The driving unit 15 used is not limited to the above unit, and any unit that can drive the supporting member 19 can be used.

The position of the supporting member 19 can be measured using another laser interferometer 32. This interferometer 32 irradiates a reflective mirror 31 fixed to the supporting member 19 with measurement light to measure the position of the supporting member 19 according to interference of reflected light and reference light. The position measurement is not limited to the position of the supporting member 19 in the Y direction. For example, a plurality of beams of measurement light can be used to measure the position of the supporting member 19 in a rotational direction about the X axis or the Z axis. The instrument used to measure the position of the supporting member 19 is not limited to a laser interferometer, and another type of instrument can be used. Thus, the driving unit 15 can be used in combination with the laser interferometer 31 to facilitate the positioning of the supporting member 19.

The holding unit 17 includes a contact portion 21 and an actuator (not shown) for actuating the contact portion 21. The actuator used can be, for example, a unit capable of quick response such as an air cylinder or an electromagnetic solenoid or any other type of actuator as known by one of ordinary skill in the relevant arts. The holding unit 17 is fixed to the base 1. The actuator moves the contact portion 21 into contact with the coupling member 16 so that the coupling member 16 can be held relative to the base 1 by frictional force. That is, the contact portion 21 can hold the supporting member 19 relative to the base 1. The holding unit 17 used is not limited to the above structure, and any unit capable of holding the supporting member 19 relative to the base 1 can be used.

FIGS. 5A to 5I are side views of the stage apparatus as viewed in the X direction, where the structure thereof is partially omitted. The operation of the stage 4 will be described with reference to FIGS. 5A to 5I, which are arranged in chronological order. In scanning using the stage apparatus according to this exemplary embodiment, the stage 4 is repeatedly shifted by a predetermined distance at constant speed. An example of application of the stage apparatus is a reticle stage for an exposure apparatus, as will be described later.

Figure 5A:
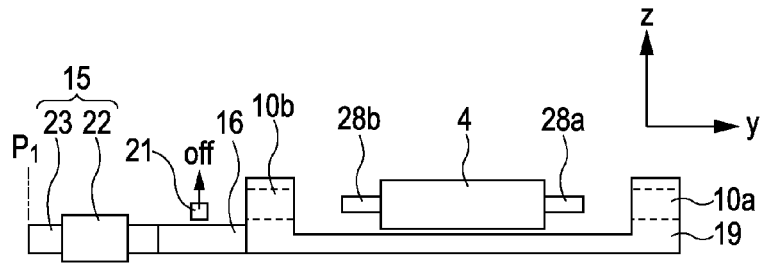
FIGS. 5A to 5I are diagrams illustrating the operation of a stage in the first exemplary embodiment.
Figure 5B:
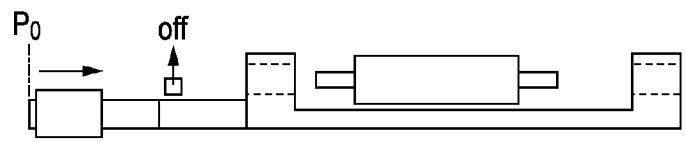
Figure 5C:
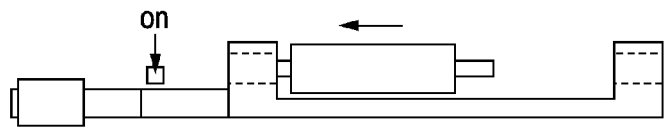

Referring to FIG. 5A, the stage apparatus is powered on, with the stage 4 and the supporting member 19 being at rest. First, the driving unit 15 is used to move the supporting member 19 from a position $P_1$ to an initial position $P_0$ (FIG. 5B). The initial position $P_0$ is the position where the supporting member 19 is located when acceleration is started for scanning. The initial position $P_0$ can be appropriately set. The holding unit 17 is not holding the supporting member 19 while the supporting member 19 is being moved. The holding unit 17 holds the supporting member 19 when the supporting member 19 reaches the initial position $P_0$ (FIG. 5C). The linear motor is then used to move the stage 4 in the −Y direction with the supporting member 19 being held. The stage 4 is moved until the movable magnet part 28b is inserted into the opening of the fixed magnet part 10b by a predetermined length, which depends on, for example, the speed required for the stage 4. Alternatively, the movable magnet part 28a and the fixed magnet part 10a can be used.

When the movable magnet part 28b is inserted into the fixed magnet part 10b, a magnetic repulsive force occurs therebetween. The holding unit 17 can prevent the supporting member 19 from being moved by the repulsive force because the holding unit 17 is holding the supporting member 19. The linear motor can produce a sufficient force opposing the repulsive force to insert the movable magnet part 28b by a predetermined length in a single stroke. In this exemplary embodiment, the linear motor causes the stage 4 to reciprocate, thereby gradually accelerating the stage 4 to insert the movable magnet part 28a by a predetermined length. The reciprocating movement can reduce the load on the linear motor to suppress heat generation.

Figure 5D:
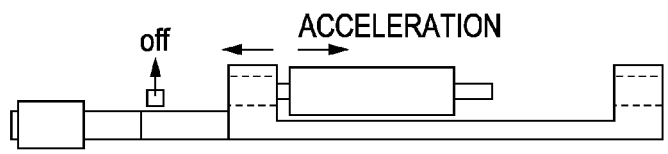
Figure 5E:
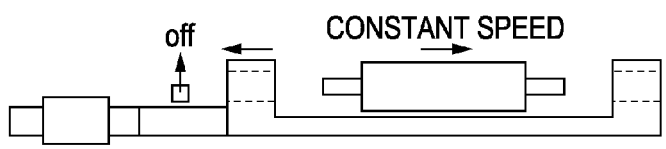

The holding unit 17 is released when the movable magnet part 28a is inserted by a predetermined length and the repulsive force decelerates the stage 4 to zero (FIG. 5D). The repulsive force then accelerates the stage 4 in the +Y direction while a reaction force moves the supporting member 19 in the −Y direction. The repulsive force decreases as the stage 4 is moved, and becomes zero when the stage 4 is sufficiently separated from the fixed magnet part 10b. The stage 4, which has been accelerated to the maximum speed at this time, is moved at constant speed to the vicinity of the stroke end where the fixed magnet part 10a is disposed (FIG. 5E). Using the linear motor, the speed can be maintained against deceleration due to air resistance and the bearings 14.

Figure 5F:
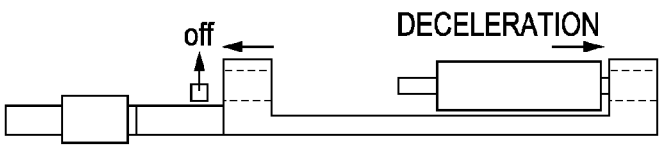
Figure 5G:
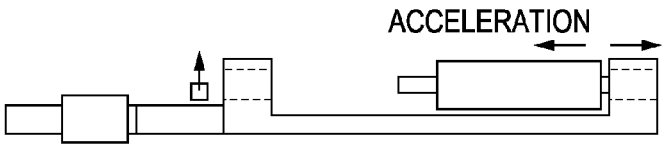
Figure 5H:
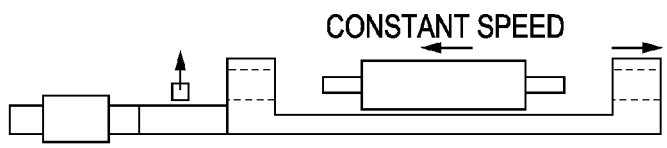

As the stage 4 is moved closer to the stroke end, the stage 4 is decelerated by the repulsive force generated between the fixed magnet part 10a and the movable magnet part 28a (FIG. 5F). Because the kinetic energy of the stage 4 is conserved, the movable magnet part 28a is inserted into the opening of the fixed magnet part 10a by the same length as the movable magnet part 28b before the speed is decreased to zero.

Figure 5I:
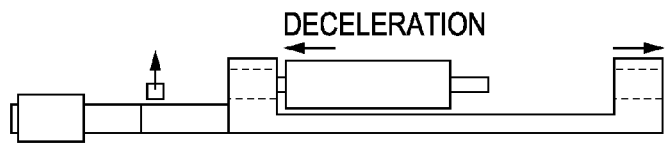

The repulsive force then accelerates the stage 4 in the −Y direction (FIG. 5G) again while a reaction force acts on the supporting member 19 in the +Y direction. The stage 4 is moved at constant speed (FIG. 5H) and is decelerated by the repulsive force (FIG. 5I). This process returns from the state of FIG. 5I to that of FIG. 5D, so that the stage 4 reciprocates.

According to this exemplary embodiment, the stage 4 can be accelerated or decelerated by the repulsive force generated between the permanent magnet 9 and the permanent magnets 12a and 12b to reduce the load on the linear motor. This contributes to, for example, a reduction in the power consumption, heat generation, and size of the stage apparatus. In addition, the supporting member 19 supporting the fixed magnet parts 10a and 10b is moved in a direction opposite to the movement direction of the stage 4 to function as a counter mass. The supporting member 19 can therefore cancel out drive reaction force without transferring it to the base 1 to suppress the vibration of the entire apparatus.

Second Exemplary Embodiment

Figure 6A:
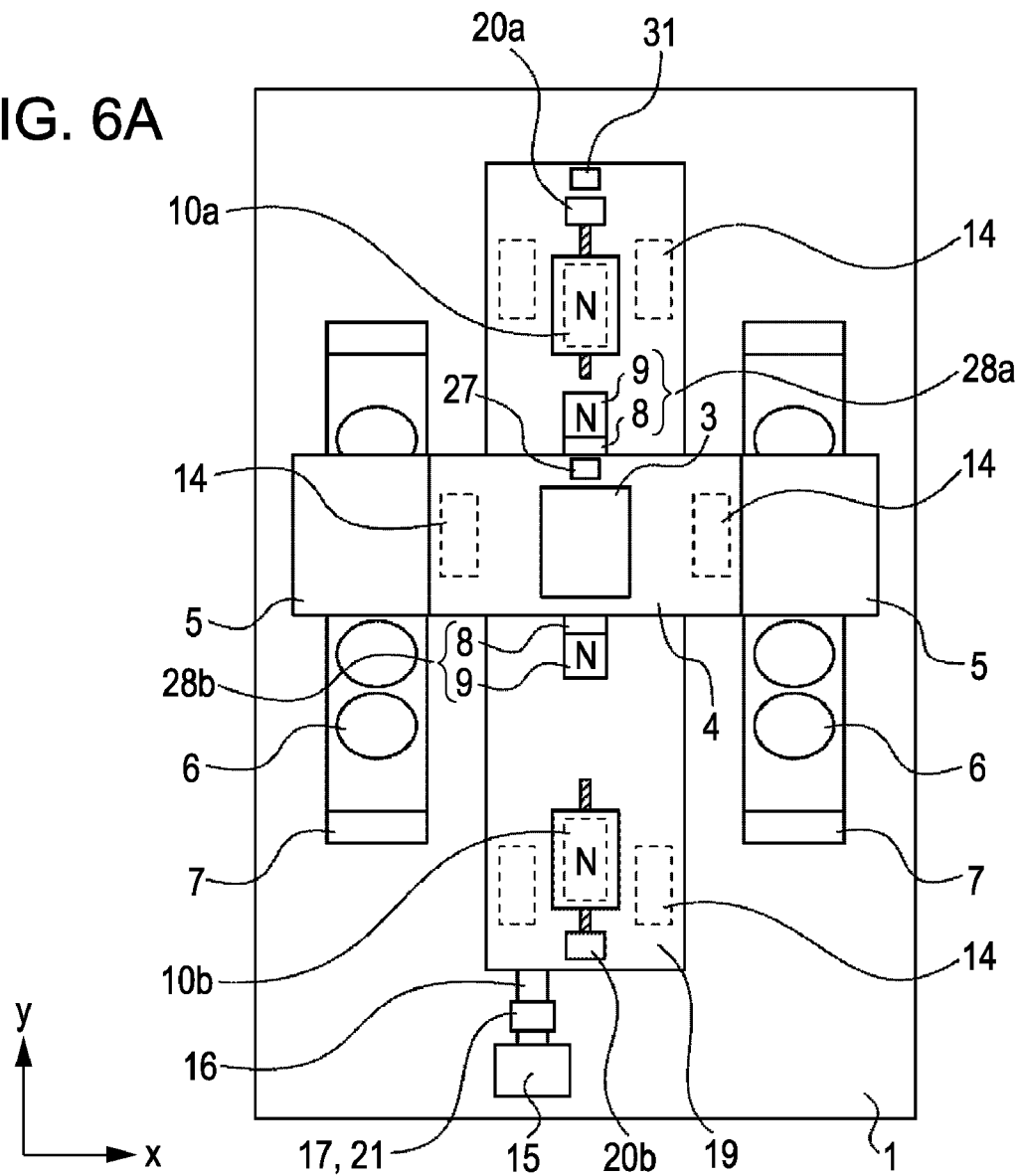
FIGS. 6A and 6B are diagrams of a stage apparatus according to a second exemplary embodiment of the present invention.
Figure 6B:
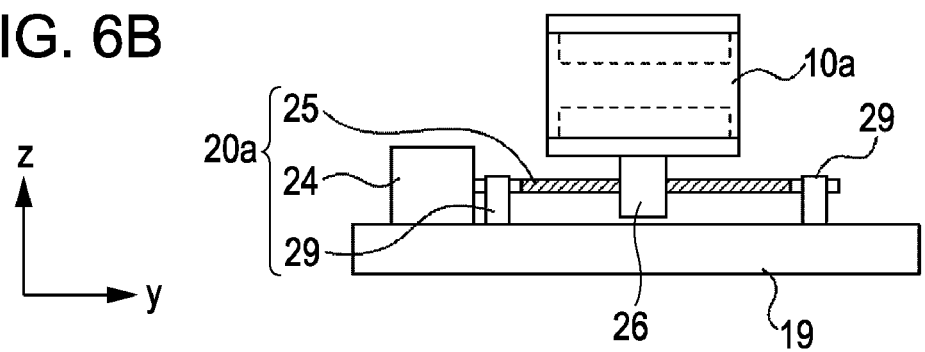

FIGS. 6A and 6B are diagrams of a stage apparatus according to a second exemplary embodiment. The individual parts of the stage apparatus are the same as those of the stage apparatus according to the first exemplary embodiment unless otherwise specified.

In FIG. 6A, the stage apparatus includes driving units 20a and 20b configured to drive the fixed magnet parts 10a and 10b, respectively, in the Y direction. FIG. 6B is a detailed diagram of the driving unit 20a. The description below will focus on the driving unit 20a, although the other driving unit 20b has the same structure. The driving unit 20a includes a nut 26 fixed to the fixed magnet part 10a, a feed screw 25, supports 29 supporting the feed screw 25, and a motor 24 for rotating the feed screw 25. The feed screw 25 is supported above the supporting member 19 by the supports 29 coaxially with a rotating shaft of the motor 24. The position of the fixed magnet part 10a can be detected using an encoder incorporated in the motor 24.

The driving units 20a and 20b can move the fixed magnet parts 10a and 10b, respectively, in the Y direction to change the position where acceleration is started. The driving units 20a and 20b can therefore change the maximum speed of the stage 4 by changing the length by which the movable magnet parts 28a and 28b are inserted into the fixed magnet parts 10a and 10b, respectively, at the stroke ends of the stage 4.

If this exemplary embodiment is applied to a reticle stage for an exposure apparatus, the insertion length can be changed for dosage adjustment. In addition, the position where acceleration is started can be adjusted for partial exposure of a reticle pattern.

Third Exemplary Embodiment

Figure 7A:
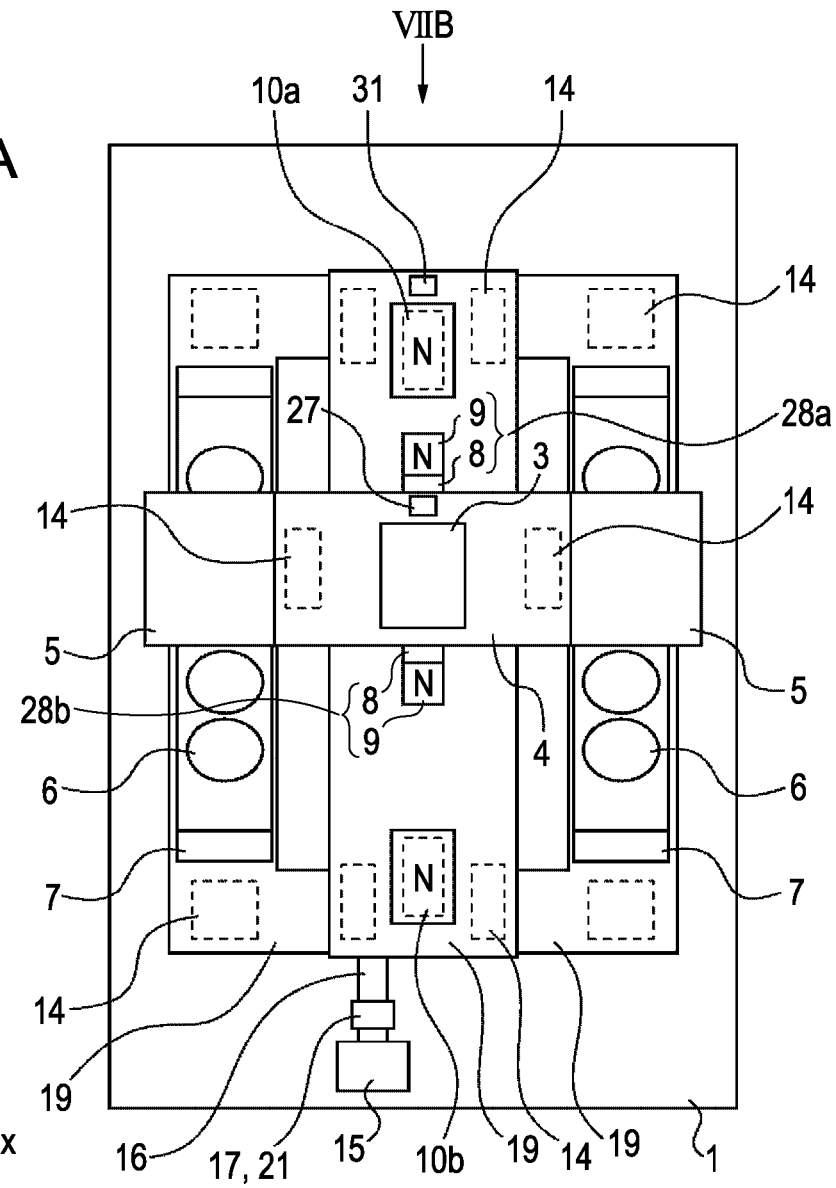
FIGS. 7A and 7B are diagrams of a stage apparatus according to a third exemplary embodiment of the present invention.

FIG. 7A is a diagram of a stage apparatus according to a third exemplary embodiment. The individual parts of the stage apparatus are the same as those of the stage apparatus according to the first exemplary embodiment unless otherwise specified.

Figure 7B:
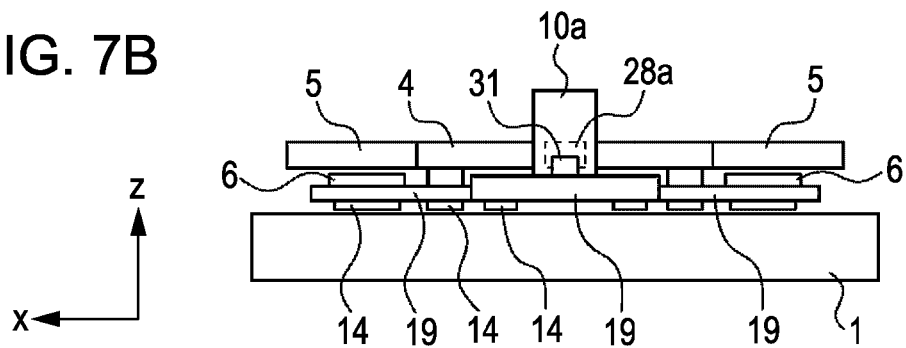

The third exemplary embodiment differs from the first exemplary embodiment in that the linear motor stators 6 are movable relative to the base 1. FIG. 7B is a side view of the stage apparatus as viewed in the direction of arrow VIIB of FIG. 7A. The supporting member 19 supports the fixed magnet parts 10a and 10b and also supports the linear motor stators 6.

As described in the first exemplary embodiment, the linear motor generates a force so that the stage 4 being moved at constant speed is not decelerated by, for example, air resistance. If the linear motor stators 6 are fixed to the base 1, a reaction force can cause slight vibrations. The stage apparatus according to this exemplary embodiment can cancel out the effect of the reaction force because the linear motor stators 6 are movable relative to the base 1.

Although the linear motor stators 6 can be used alone as a counter mass, the supporting member 19 can also be used as a counter mass, as described above. The distance over which the counter mass is moved to cancel out the reaction force depends on the weight ratio of the counter mass to the stage 4. The distance can therefore be reduced by increasing the weight of the counter mass. This results in a reduction in the size of the apparatus.

Fourth Exemplary Embodiment

FIGS. 8A to 8I are diagrams showing the operation of the stage 4 in a fourth exemplary embodiment. While the holding unit 17 is used to hold the supporting member 19 in the first exemplary embodiment, a stage apparatus according to this exemplary embodiment does not include the holding unit 17. The operation of the stage 4 in this exemplary embodiment will be described.

In FIG. 8A, the stage apparatus is powered on, with the stage 4 and the supporting member 19 being at rest. First, the driving unit 15 is used to move the supporting member 19 from an initial position $P_0$ to a position $P_2$ in the −Y direction and stop it there before the stage 4 is moved in the +Y direction (FIG. 8B). When the movable magnet part 28a is inserted into the opening of the fixed magnet part 10a, the stage 4 is accelerated in the −Y direction while the supporting member 19 is moved in the +Y direction by a reaction force. Referring to FIG. 8C, the movable magnet part 28b is inserted into the opening of the fixed magnet part 10b by a predetermined length. If the movable magnet part 28b cannot be inserted by the predetermined length in a single stroke, the stage 4 can be gradually accelerated by reciprocating movement, as described in the first exemplary embodiment. The subsequent steps are the same as those of the first exemplary embodiment, and thus a detailed description thereof will be omitted.

As described above, the stage apparatus according to the fourth exemplary embodiment does not include the holding unit 17 and has an acceleration region where the supporting member 19 is moved to the initial position $P_0$. An extended acceleration region can be defined by, for example, setting the position $P_2$ to the end of the stroke of the supporting member 19.

The stage apparatus according to the first exemplary embodiment can produce an increased amount of dust because the contact portion 21 comes into contact with the coupling member 16 to hold it by friction. On the other hand, the stage apparatus according to the fourth exemplary embodiment does not include the holding unit 17 and thus produces no dust therefrom. The stage apparatus can therefore suppress dust production to maintain a clean environment, which allows for easy maintenance.

Example of Application to Exposure Apparatus

Figure 9:
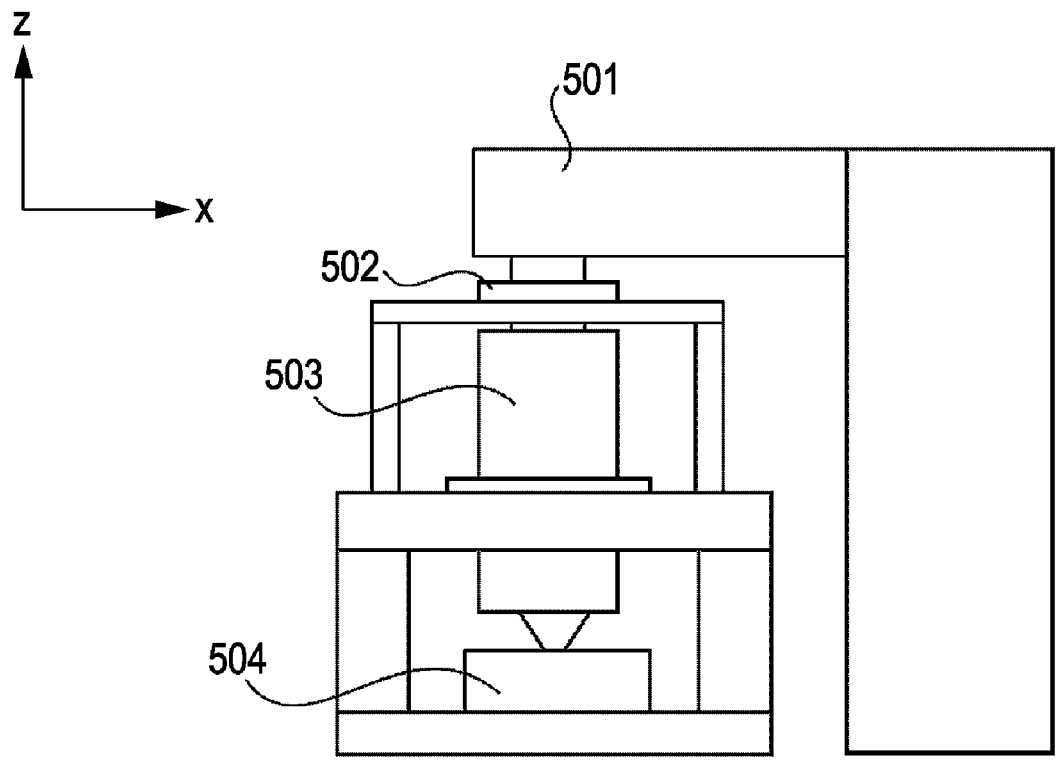
FIG. 9 is a schematic diagram of an exposure apparatus including a stage apparatus according to at least one exemplary embodiment of the present invention.

An example of an exposure apparatus including a stage apparatus according to the present invention will be described. Referring to FIG. 9, the exposure apparatus includes an illumination unit 501, a reticle stage 502 holding a reticle, a projection optical system 503, and a wafer stage 504 holding a wafer. This exposure apparatus is a step-and-scan projection exposure apparatus that exposes the wafer by projecting a circuit pattern of the reticle onto the wafer. The stage apparatuses according to the above exemplary embodiments can be used as the reticle stage 502.

The illumination unit 501 includes a light source and an illumination optical system to illuminate the reticle having the circuit pattern. The light source used is, for example, a laser such as an ArF excimer laser (wavelength: about 193 nm), a KrF excimer laser (wavelength: about 248 nm), or an F2 excimer laser (wavelength: about 153 nm). The type of laser used is not limited to an excimer laser and can also be, for example, a YAG laser. Also, the number of lasers used is not limited. Such a laser can be used as the light source in combination with a beam-shaping optical system for shaping a collimated beam emitted from the laser and an incoherent optical system for converting a coherent laser beam to incoherent light. The light source used is not limited to a laser, and one or more lamps such as a mercury lamp or a xenon lamp can also be used.

The illumination optical system is used to illuminate a mask and includes components such as a lens, a mirror, a light integrator, and an aperture stop. The illumination optical system illuminates the reticle with slit-shaped light. The longitudinal direction of the slit-shaped light is the X direction while the lateral direction thereof is the Y direction. In scanning, the reticle stage 502 is moved in the lateral direction of the slit-shaped light, that is, in the Y direction. Light passing through the reticle enters the projection optical system 503.

The projection optical system 503 used can be, for example, an optical system including only lens elements, an optical system including lens elements and at least one concave mirror (catadioptric optical system), an optical system including lens elements and at least one diffractive optical element such as a kinoform, or an all-mirror optical system. The projection optical system 503 projects the pattern of the reticle to a reduced size to expose the wafer mounted on the wafer stage 504.

This exposure apparatus can be used for manufacture of devices having fine patterns, including semiconductor devices such as semiconductor integrated circuits, micromachines, and thin-film magnetic heads.

Figure 10:
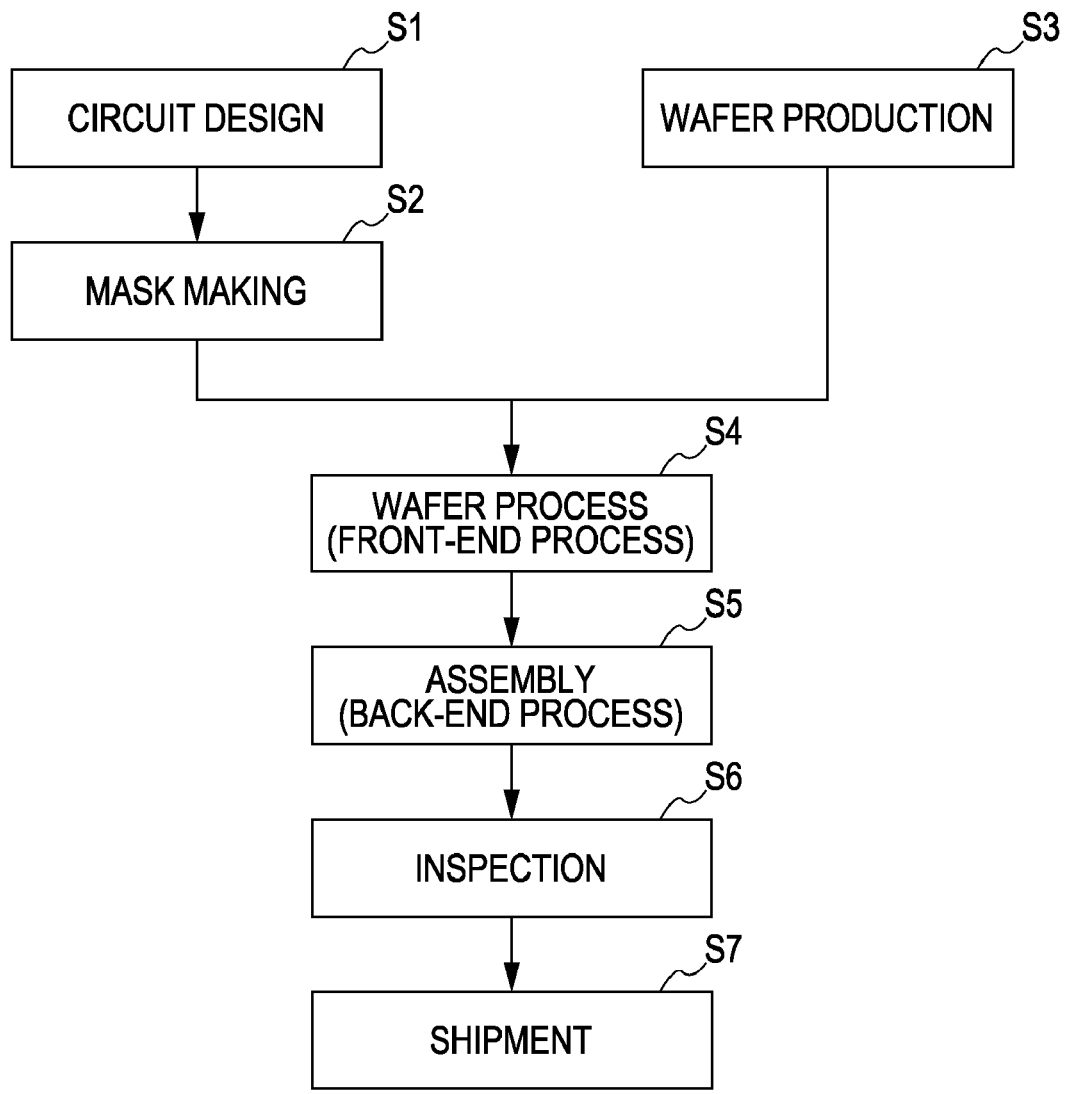
FIG. 10 is a flowchart of a process for producing devices using the exposure apparatus.

Next, an example of a process for producing devices (e.g., semiconductor chips such as ICs or LSIs, LCDs, or CCDs) using the above exposure apparatus will be described with reference to FIGS. 10 and 11, which are flowcharts of the process. In this example, a process for producing semiconductor chips will be described.

In Step S1 (circuit design), the circuitry of the semiconductor chips is designed. In Step S2 (mask making), a mask is prepared according to the designed circuit pattern. In Step S3 (wafer production), a wafer is produced using a material such as silicon. In Step S4 (wafer process), also called a front-end process, actual circuitry is formed on the wafer using the mask and the exposure apparatus by photolithography. In Step S5 (assembly), also called a back-end process, the wafer subjected to Step S4 is processed into semiconductor chips. This assembly process includes, for example, an assembly step (dicing and bonding) and a packaging step (chip sealing). In Step S6 (inspection), the semiconductor devices produced in Step S5 are subjected to inspection such as an operation test and a durability test. After these steps, the semiconductor devices are completed and shipped (Step S7).

Figure 11:
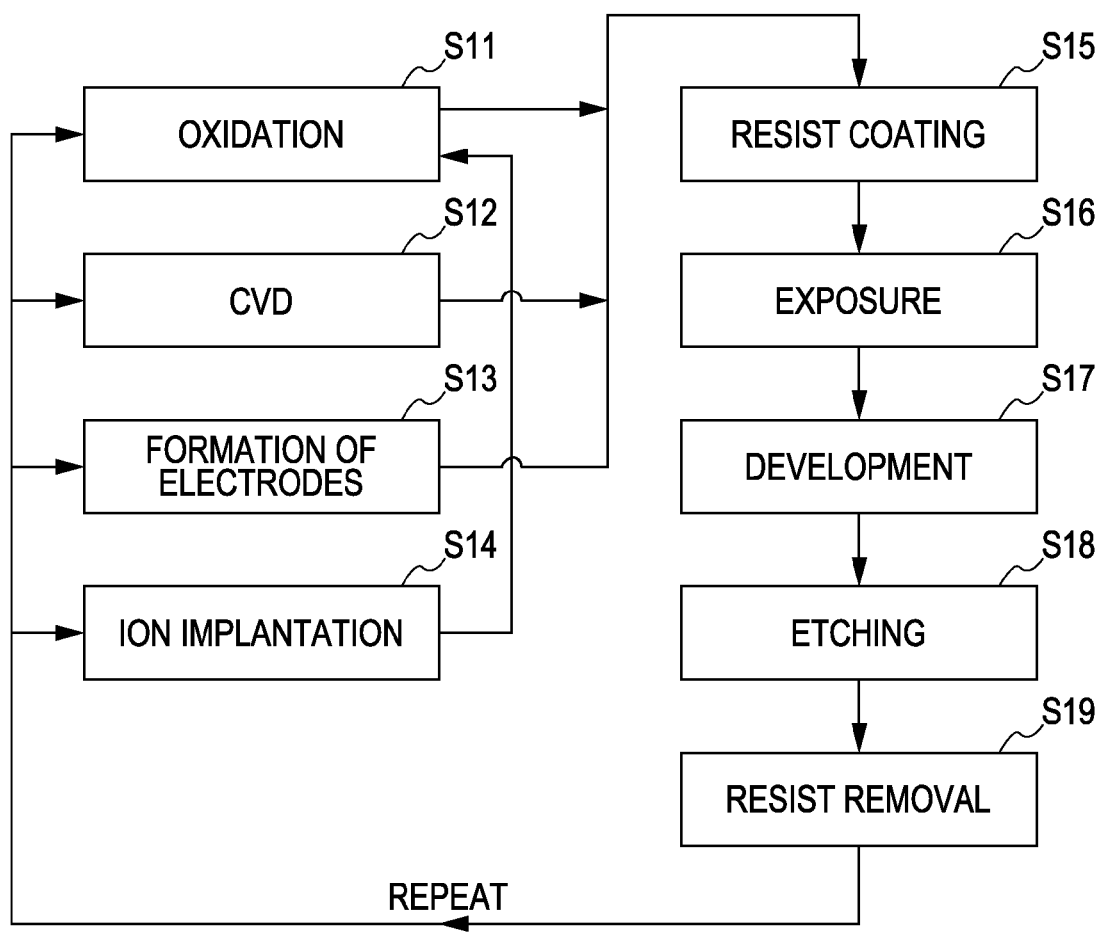
FIG. 11 is a detailed flowchart of a wafer process in Step S4 of the flowchart of FIG. 10.
Figure 12A:
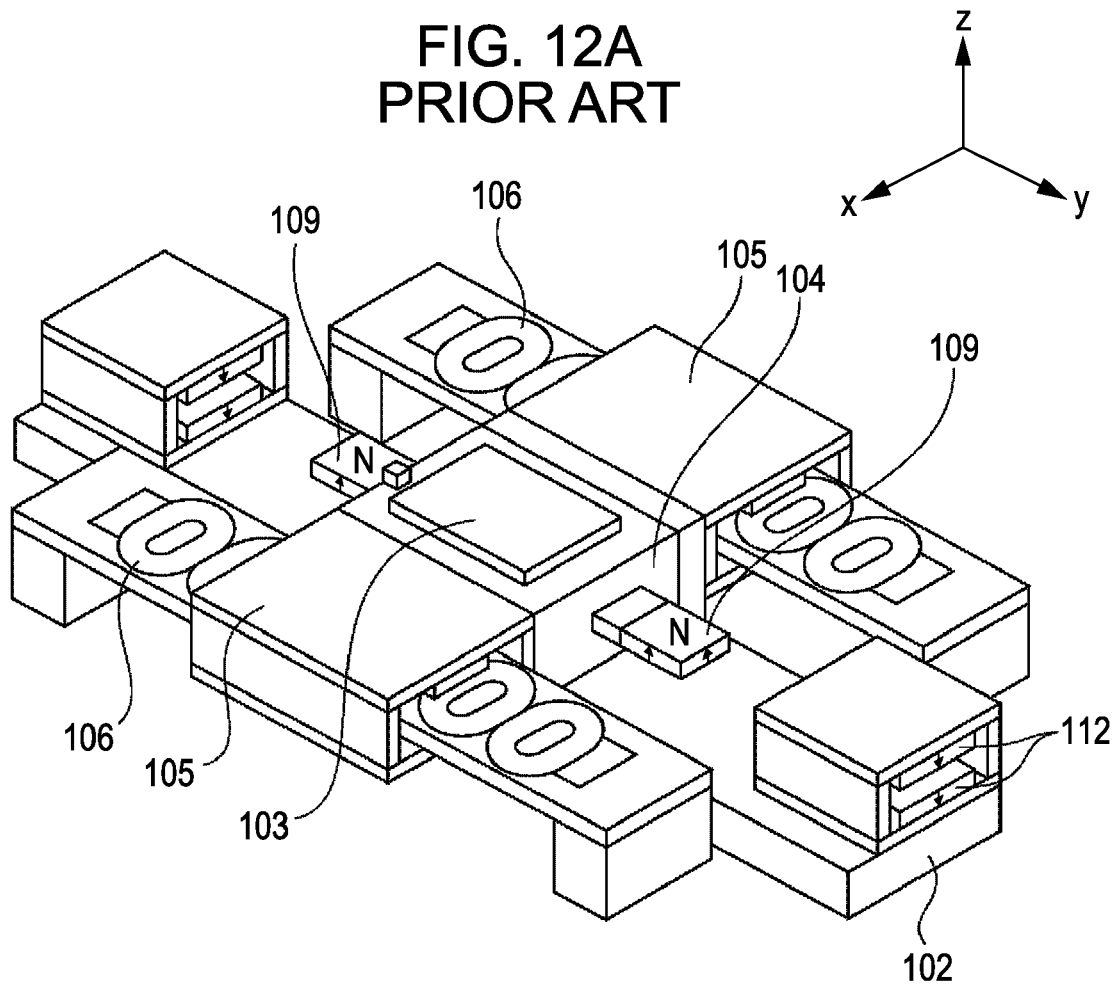
FIGS. 12A and 12B are diagrams of a known stage apparatus including a repulsive acceleration unit.
Figure 12B:
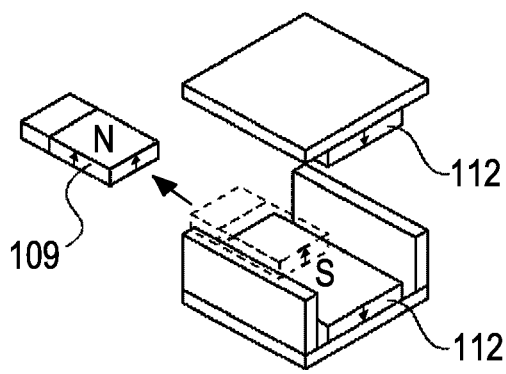

FIG. 11 is a detailed flowchart of the wafer process of Step S4. In Step S11 (oxidation), a surface of the wafer is oxidized. In Step S12 (CVD), an insulating film is formed on the surface of the wafer. In Step S13 (formation of electrodes), electrodes are formed on the wafer by deposition. In Step S14 (ion implantation), ions are implanted into the wafer. In Step S15 (resist coating), the wafer is coated with a photoresist. In Step S16 (exposure), the circuit pattern of the mask is formed on the wafer by exposure using the exposure apparatus. In Step S17 (development), an image formed on the exposed wafer is developed. In Step S18 (etching), the portions of the resist other than the developed image are etched. In Step S19 (resist removal), the unnecessary resist left after the etching is removed. These steps are repeated to form circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-179816 filed Jun. 29, 2006, which is hereby incorporated by reference herein in its entirety.

What is claimed is:

1. A stage apparatus comprising:
   a stage movable in a first direction;
   a linear motor configured to drive the stage in the first direction;
   a magnet unit having first magnets disposed on the stage and second magnets disposed at both ends of a stroke of the stage such that the same poles of the first and second magnets face each other;
   a supporting member supporting the second magnets, the supporting member being supported movably in the first direction; and
   a second-magnet driving unit configured to move the second magnets relative to the supporting member in the first direction.

2. The stage apparatus according to claim 1, wherein the linear motor includes a slider and a stator supported by the supporting member.

3. The stage apparatus according to claim 1, wherein the point of action of a force generated by the magnet unit, the center of gravity of the stage, and the center of gravity of the supporting member are positioned at substantially the same height.

4. An exposure apparatus for forming a pattern of an original on a substrate by exposure, the exposure apparatus comprising the stage apparatus according to claim 1 to position the original.

5. A method for producing a device, comprising the steps of:
   exposing a substrate using the exposure apparatus according to claim 4; and
   subjecting the exposed substrate to development.

6. The stage apparatus according to claim 1, wherein the second magnets are arranged at an interval perpendicularly to the first direction, and the first magnets are insertable between the second magnets.

7. The stage apparatus according to claim 1, wherein the first magnets are disposed on the front and rear sides of the stage in the first direction.

8. The stage apparatus according to claim 1, further comprising:
   a driving unit configured to drive the supporting member; and
   a holding unit configured to hold the supporting member.

* * * * *